(12) United States Patent
Fang et al.

(10) Patent No.: US 8,710,883 B1
(45) Date of Patent: Apr. 29, 2014

(54) PHASE LOCK LOOP WITH INJECTION PULSE CONTROL

(71) Applicant: Xilinx, Inc., San Jose, CA (US)

(72) Inventors: Wayne Fang, Pleasanton, CA (US); Parag Upadhyaya, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/630,192

(22) Filed: Sep. 28, 2012

(51) Int. Cl.
   *H03L 7/06* (2006.01)
(52) U.S. Cl.
   USPC .......................................... 327/157; 327/148
(58) Field of Classification Search
   None
   See application file for complete search history.

(56) References Cited

U.S. PATENT DOCUMENTS

| | | | |
|---|---|---|---|
| 7,557,625 B1 * | 7/2009 | Bazes | 327/157 |
| 8,169,265 B2 * | 5/2012 | Liu | 331/17 |
| 8,564,347 B2 * | 10/2013 | Xu et al. | 327/158 |

OTHER PUBLICATIONS

Miyazaki, Takahito et al., "A Perfomance Comparison of PLLs for Clock Generation Using Ring Oscillator VCO and LC Oscillator in a Digital CMOS Process," *Proc. of the 2004 Asia and South Pacific Design Automation Conference*, Jan. 27, 2004, pp. 545-546, IEEE, Piscataway, New Jersey, USA.

* cited by examiner

*Primary Examiner* — Cassandra Cox
(74) *Attorney, Agent, or Firm* — W. Eric Webostad; Lois D. Cartier

(57) ABSTRACT

An apparatus comprises a lock-loop circuit including an oscillator, a frequency detector, a charge pump, and a regulator. The regulator is coupled to provide a regulated signal to the oscillator to control frequency. The oscillator and the frequency detector are coupled to receive a reference clock signal. The reference clock signal is coupled to the oscillator to suppress noise in the oscillator by pulse injection. The frequency detector is coupled to receive an oscillator output from the oscillator.

17 Claims, 9 Drawing Sheets

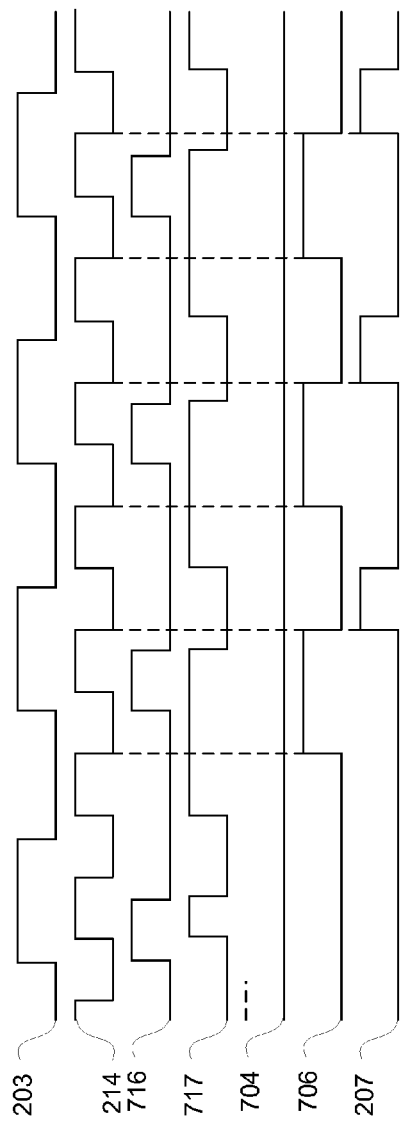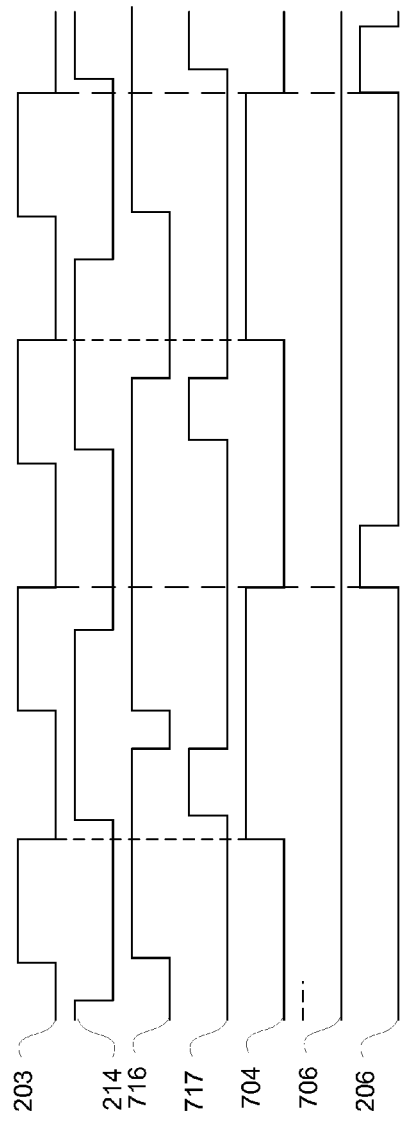

PHASE LOCK LOOP WITH INJECTION PULSE CONTROL

FIELD OF THE INVENTION

An embodiment relates to integrated circuit devices ("ICs"). More particularly, an embodiment relates to a phase lock loop with injection pulse control for an IC.

BACKGROUND

Some phase lock loops ("PLLs") may be configured to have little phase noise, such as inductor-capacitor or "tank" circuit phase lock loops ("LC PLLs") for example, at high frequencies of operation, such as in excess of 16 GHz for example. Such LC PLLs conventionally consume a significant amount of power and semiconductor die area. For such high frequency operation, it would be beneficial if input/output blocks, transceiver blocks, and other communication blocks could have a local PLL that has low power and low phase noise. However, such communication blocks conventionally are too numerous on a semiconductor die for each such communication block to have its own LC PLL, for reasons of power distribution and/or size limitations.

Accordingly, it would be both desirable and useful to provide a PLL with sufficiently low power and phase noise for widespread usage on a semiconductor die.

SUMMARY

One or more embodiments generally relate to a PLL with injection pulse control for an IC.

An apparatus comprises a lock-loop circuit including an oscillator, a frequency detector, a charge pump, and a regulator. The regulator is coupled to provide a regulated signal to the oscillator to control frequency. The oscillator and the frequency detector are coupled to receive a reference clock signal. The reference clock signal is coupled to the oscillator to suppress noise in the oscillator by pulse injection. The frequency detector is coupled to receive an oscillator output from the oscillator.

Another apparatus comprises a reference PLL configured to provide a global reference clock signal. A plurality of ring PLLs are coupled to receive the global reference clock. The reference PLL is configured to produce less phase noise than each of the plurality of ring PLLs. The plurality of ring PLLs are coupled to receive the global reference clock signal for injection pulsing to suppress phase noise in each of the plurality of ring PLLs.

BRIEF DESCRIPTION OF THE DRAWINGS

Accompanying drawings show exemplary embodiments. However, the accompanying drawings should not be taken to limit the embodiments shown, but are for explanation and understanding only.

FIGS. 9-1 through 9-4 are signal diagrams depicting various waveforms for the frequency detector of FIG. 7.

DETAILED DESCRIPTION

Figure 1:
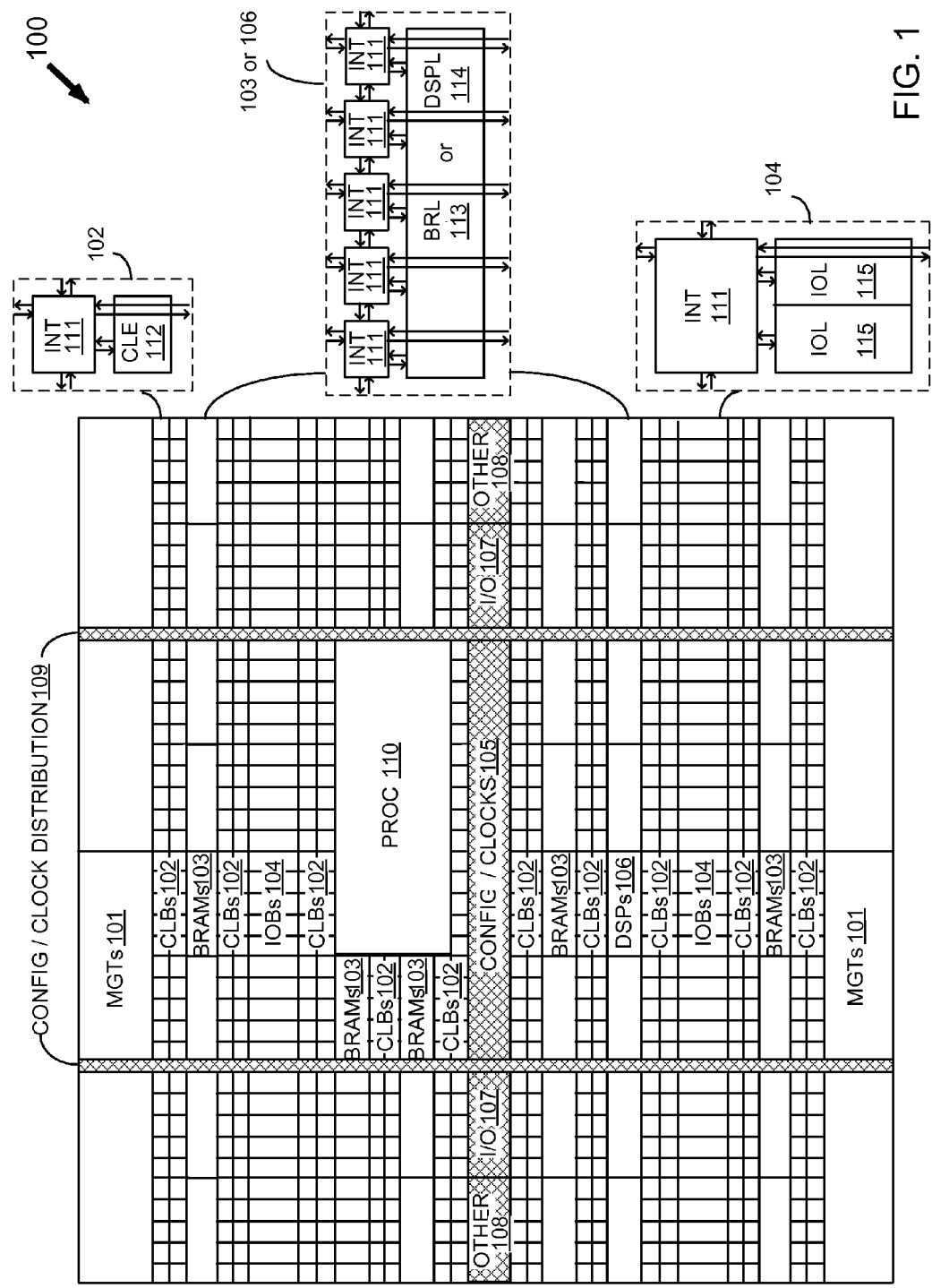
FIG. 1 is a simplified block diagram depicting an exemplary columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

As frequencies of operation, and thus data rates, increase, margin of error is reduced. Thus, phase noise that may have been tolerated in the past, is now too significant an error inducer to be tolerated. While there are phase lock loops ("PLLs") that produce little phase noise during operation sufficient for high-frequency operation, such PLLs conventionally are too big and/or consume too much power for widespread use as local PLLs on a semiconductor die. For example, a field programmable gate array ("FPGA") may include many transceivers, where each transceiver includes its own local PLL. Having for example LC PLLs in each transceiver to support 16 GHz operation and beyond would make FPGA die too big and consume too much power, to be commercially impractical.

With the above general understanding borne in mind, various embodiments for an injection-lock PLL are generally described below. As described below in additional detail, a global reference clock signal having little to no phase noise for an application may be provided to a ring PLL for both frequency detection and pulse injection. Pulse injection allows for phase noise suppression in an oscillator which would otherwise be too noisy for sufficiently reliable operation at frequencies in excess of 16 GHz. Such injected pulses are based on such global reference clock signal, so they provide an index to pulse edges of waveforms generated by an oscillator. Effectively, injected pulses are used to reduce variation of locations of edges due to phase noise.

Because one or more of the above-described embodiments are exemplified using a particular type of IC, a detailed description of such an IC is provided below. However, it should be understood that any IC using multiple PLLs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
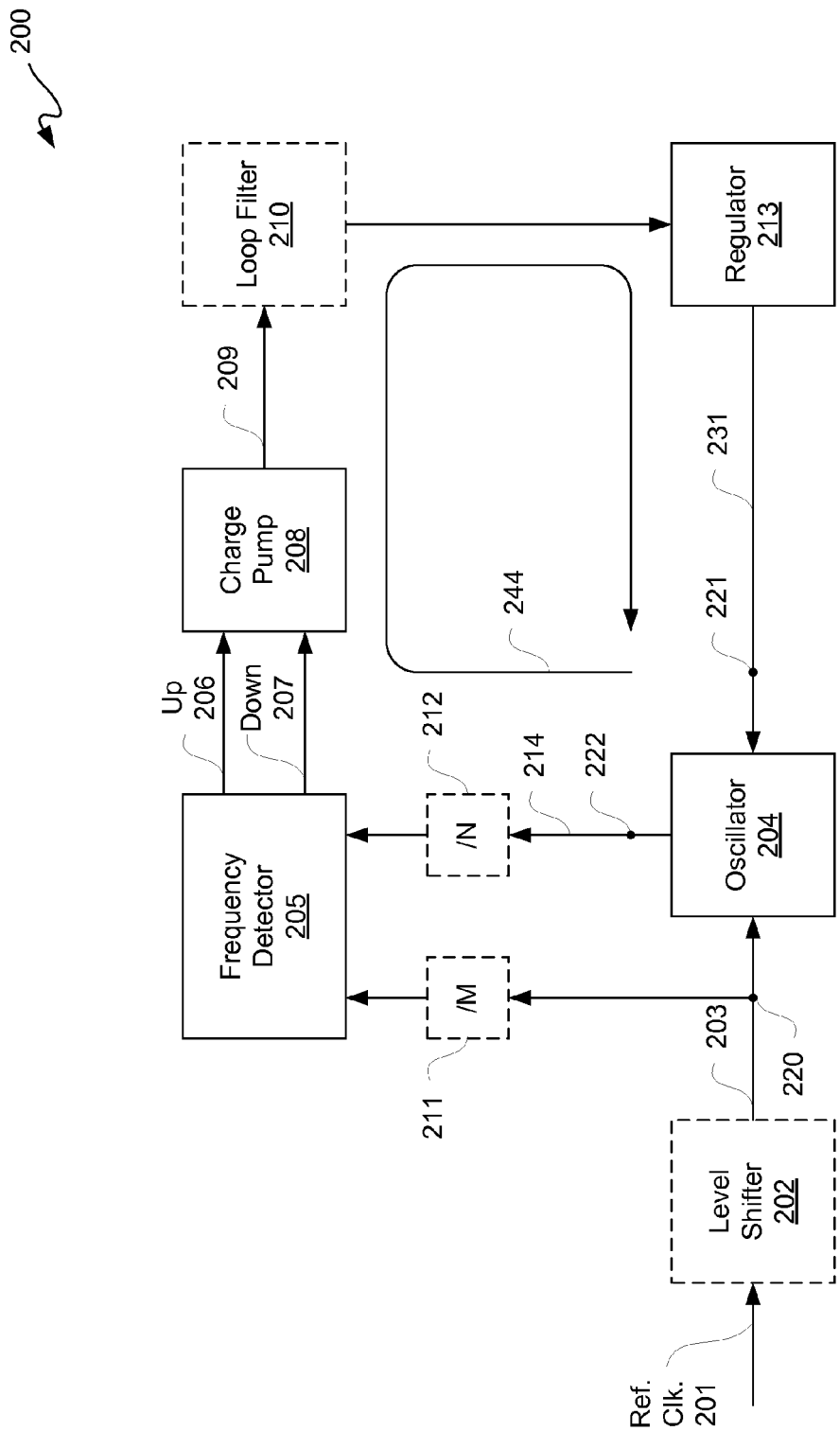
FIG. 2 is a block diagram depicting an exemplary injection-locked phase lock loop ("PLL").

FIG. 2 is a block diagram depicting an exemplary injection-locked phase lock loop ("PLL") 200. PLL 200 includes a frequency detector 205, a charge pump 208, a regulator 213, and an oscillator 204 in a loop 244. Regulator 213 may be a voltage regulator or a current regulator. In other PLLs, more than one charge pump may be used. However, for purposes of clarity by way of example and not limitation, it shall be assumed that regulator 213 is a voltage regulator for this PLL. PLLs 200 may be local PLLs for various types of communication blocks of an FPGA 100, such as MGTs and IOBs for example.

Voltage regulator 213 may be coupled to provide a regulated signal 231 to oscillator 204 to control frequency, as described below in additional detail. For a voltage regulator 213, oscillator 204 may be a voltage controlled oscillator ("VCO") 204 for this circuit. VCO 204 and frequency detector 205 are coupled to receive a reference clock signal 203.

Reference clock signal 203 may be coupled to frequency detector 205 via an optional divider 211. Divider 211 may divide frequency of reference clock signal 203 by M, for M a positive value greater than or equal to one, to provide a divided down version of reference clock signal 203 for input to frequency detector 205. An oscillator output 214 from VCO 204 may be coupled to frequency detector 205 via an optional divider 212. Divider 212 may divide frequency of oscillator output 214 by N, for N a positive value greater than or equal to one, to provide a divided down version of oscillator output 214 for input to frequency detector 205. Positive values for M and N may be the same or different. For example, M and N may both equal 8 to provide a divide ratio of 8; however, in other embodiments, other values may be used as may vary from application-to-application. For instances where either or both M and N equal 1, such associated dividers may be removed and may be replaced with clock buffers.

Reference clock signal 203 may be from a "cleaner" source than VCO 204. By "cleaner," it is generally meant a signal with less noise. Reference clock signal 203 may be coupled to VCO 204 to suppress noise in VCO 204. Along those lines, noise in loop 244 may be effectively trapped. In other words, such noise is more or less not transitory as in pass through configurations. Thus, by effectively super-positioning a transfer function of a clean signal onto a transfer function of a noisy signal, or vice versa, noise of the noisy signal may be reduced or suppressed. Basically, two signals of different frequencies may produce a beat frequency or beating. Conventionally, beating in a PLL is to be avoided; however, here by getting a clean signal and a noisy signal sufficiently close to one another in terms of frequency such that the clean signal and the noisy signal lock to one another, a beat frequency signal may be produced which is cleaner than the noisy signal. As described herein, noise in VCO 204 may be suppressed by application of a cleaner reference clock signal 203. Thus, oscillator output 214 from VCO 204, which may be coupled to frequency detector 205, may be cleaner than without use of such cleaner reference clock signal 203.

Reference clock signal 203 may be level-shifted from an external reference clock signal 201. For example, a clean external reference clock signal 201 may be provided to an optional level shifter 202. For example, level shifter 202 may be a CML-to-CMOS level shifter in order to provide reference clock signal 203 at CMOS levels. For example, level shifter 202 may be an AC coupled self-biased inverter configured to convert CML signaling levels to CMOS signaling levels. External reference clock signal 201 may be from a crystal oscillator, such as a voltage-controlled crystal oscillator ("VCXO"). External reference clock signal 201 may be provided from an on-chip inductor-capacitor, such as an inductor-capacitor tank circuit phase lock loop ("LC PLL") having low phase noise.

Frequency detector 205 may be configured to provide either an up signal 206 or a down signal 207 responsive to a frequency difference between reference clock signal 203 and oscillator output 214, including without limitation divided down versions thereof. Frequency detector 205 may be insensitive to phase offset between reference clock signal 203 and oscillator output 214. Up signal 206 and down signal 207 may be provided from frequency detector 205 as inputs to charge pump 208. Responsive to up/down signaling, charge pump 208 may output a charge signal 209 to voltage regulator 213 via an optional loop filter. Loop filter 210 may be low-pass filter. Loop filter 210 may be a first order loop filter, as a first order loop filter may be sufficient for an application and may reduce overall footprint of PLL 200. An example of a first order loop filter may be a capacitor coupled between ground and the output of a charge pump. Optionally, a second order loop filter may be used for loop filter 210. An example of a second order loop filter may be a capacitor in parallel with a resistor and a capacitor in series, where such parallel circuit may be coupled between the output of a charge pump and ground.

For regulator 213 a voltage regulator, a regulated voltage output 231 may be provided from regulator 213 as an input to VCO 204. VCO 204 may have input nodes 220 and 221 respectively for receiving reference clock signal 203 and regulated voltage output 231. VCO 204 may further include an output node 222 from which oscillator output 214 may be sourced.

Figure 3:
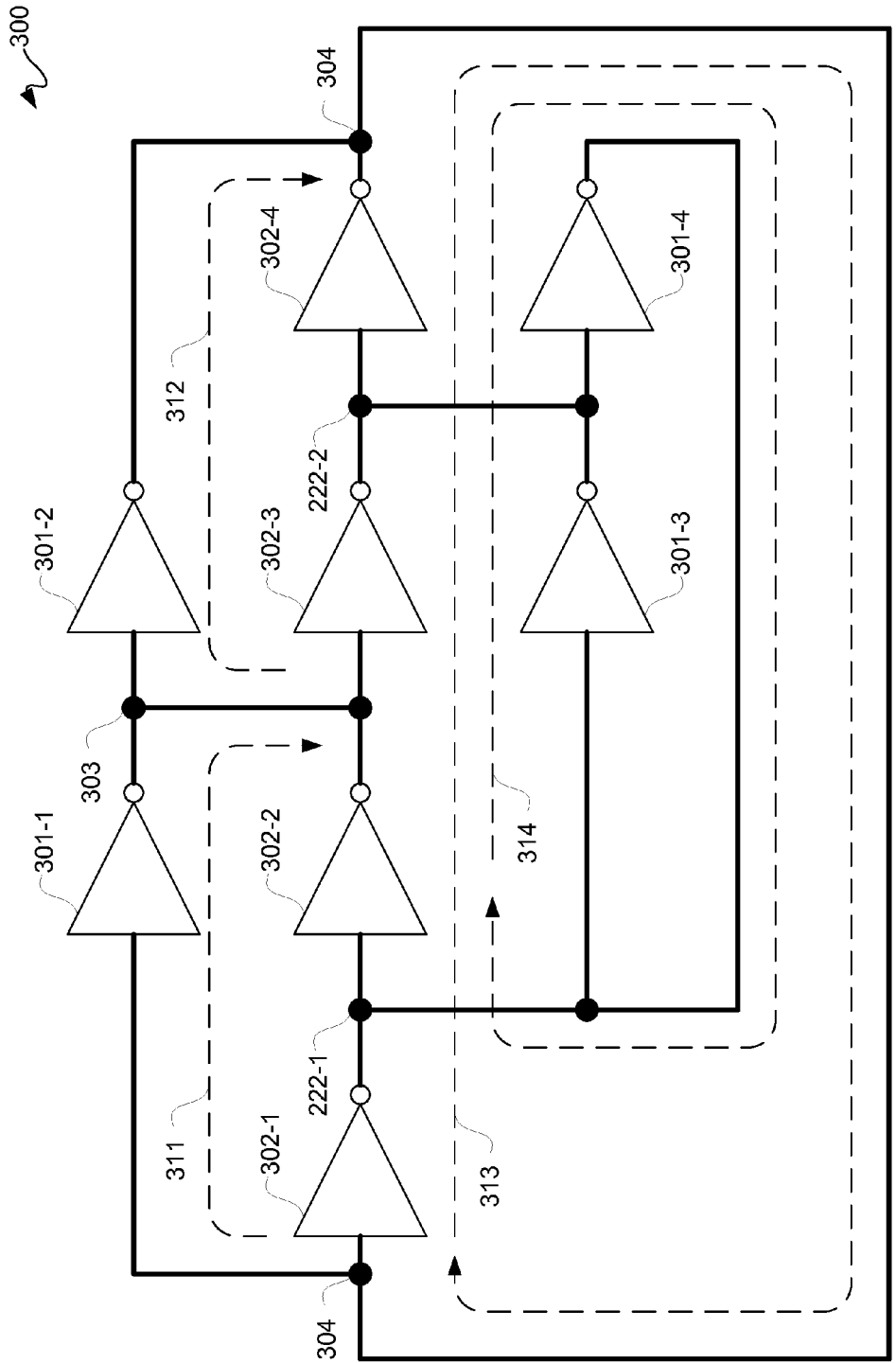
FIG. 3 is a circuit diagram depicting an exemplary voltage controlled oscillator ("VCO").

FIG. 3 is a circuit diagram depicting an exemplary VCO 300. VCO 300 may be VCO 204 of FIG. 2, for example. Even though VCO 300 is illustratively depicted with single rails for purposes of clarity, such single rails may be dual rails in this example. In other embodiments, single rails may be used. With simultaneous reference to FIGS. 2 and 3, VCO 300 is further described.

VCO 300 may include two types of inverters. Inverters 302, which include inverters 302-1 through 302-4, may be coupled in a ring 313 as a main stage. Inverters 301, which include inverters 301-1 through 301-4, may be coupled as interpolation stage inverters, as described below in additional detail. Ring 313 of inverters 302 may be a main stage of a feed-forward interpolating 4-stage ring VCO 300 with charge injection points for pulse injection. However, in other embodiments, fewer or more stages may be used for VCO 300. Main stage inverters 302 may be significantly stronger than interpolation stage inverters 301.

Inverters 302 may be coupled to receive regulated signal 231, as described below in additional detail. Regulated signal 231 may be for regulated control of voltage of inverters 302. Furthermore, for purposes of clarity by way of example and not limitation, it shall be assumed that inverters 302 operate at CMOS levels, and thus a CMOS ring 313 with regulated voltage control is described below in additional detail.

Node 304 may be coupled to an input of inverter 301-1, an input of inverter 302-1, an output of inverter 301-2, and an output of inverter 302-4. Node 222-1 may be coupled to an output of inverter 302-1 and an input of inverter 302-2. Node 222-1 is further coupled to an input of inverter 301-3 and an output of inverter 301-4. Node 303 may be coupled to an input of inverter 301-2, an input of inverter 302-3, an output of inverter 301-1, and an output of inverter 302-2. Node 222-2 may be coupled to an output of inverter 302-3 and an input of inverter 302-4. Node 222-2 is further coupled to an output of inverter 301-3 and an input of inverter 301-4.

Inverter 301-1 provides an interpolation path 311 from node 304 to node 303, and inverter 301-2 provides an interpolation path 312 from node 303 to node 304. Inverters 301-3 and 301-4 provide an interpolation loop path 314 with taps at nodes 222-1 and 222-2. Thus, interpolation inverters 301 are coupled at multiple nodes as interpolation stages to a main stage ring 313 of inverters 302 of VCO 300.

Nodes 222-1 and 222-2 are more generally depicted as output node 222. As these nodes may be dual railed, different clock points may be sampled or output from VCO 300. For purposes of clarity by way of example and not limitation, output node 222-1 may be for 0 and 180 degree clock points, namely for a 0 degree clock and a 180 degree clock, and output node 222-2 may be for 90 and 270 degree clock points, namely for a 90 degree clock and a 270 degree clock. However, even though four taps for quadrature clocks are illustratively depicted, other embodiments may use fewer or more than four taps Inverters 301 for interpolation stages may be conventional inverters, which continuing the above example, may be conventional CMOS inverters. Accordingly, inverters 301 are not described in unnecessary detail. However, inverters 302 may be cross-coupled dual rail inverters with injection points, as described below in additional detail with reference to FIG. 4.

Figure 4:
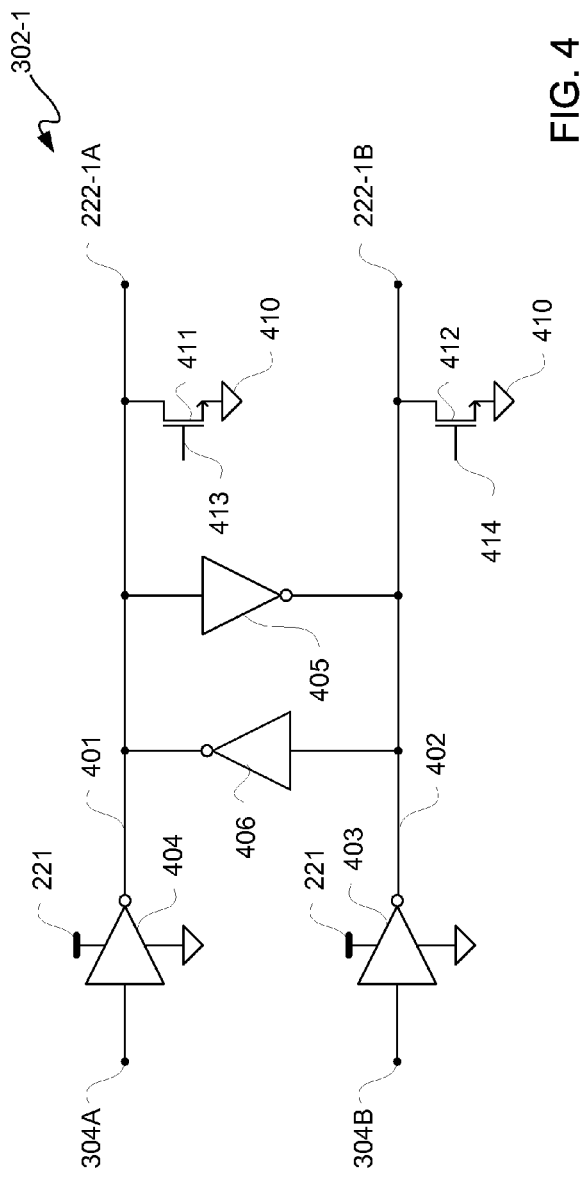
FIG. 4 is a circuit diagram depicting an exemplary inverter that can be used in the VCO of FIG. 3.

FIG. 4 is a circuit diagram depicting an exemplary inverter 302-1 of FIG. 3. Even though inverter 302-1 is illustratively depicted, inverter 302-1 is the same configuration as any of inverters 302 of FIG. 3. Inverter 302-1 is further described with simultaneous reference to FIGS. 2 through 4.

Node 304A and node 304B, generally depicted in FIG. 3 as node 304, may be separate nodes respectively associated with rails 401 and 402 of a dual rail configured inverter 302-1. In other words, inverter 302-1 is a two rail inverter. Inverters 403 through 406 may be conventional CMOS inverters. Input of inverter 404 may be coupled to node 304A, and input of inverter 403 may be coupled to node 304B. Output of inverter 404 may be coupled to rail 401, and output of inverter 403 may be coupled to rail 402.

An input node 221 of VCO 300 may be a supply voltage node 221 of each of inverters 404 and 403. Inverters 405 and 406 may be coupled to a different supply voltage node, such as a Vdd supply voltage node, rather than supply voltage node 221. An output of each of inverters 404 and 406 may be coupled to rail 401, and an input of inverter 405 may be coupled to rail 401. An output of each of inverters 403 and 405 may be coupled to rail 402, and an input of inverter 406 may be coupled to rail 402. Thus, inverters 405 and 406 cross-couple rails 401 and 402. In other words, inverter 302-1 is a two rail inverter, where such rails 401 and 402 are cross coupled to one another.

Rail 401 may be coupled to node 222-1A, and rail 402 may be coupled to node 222-1B. Nodes 222-1A and 222-1B are generally depicted as node 222-1 in FIG. 3. A voltage coupling device, such as pull-down NMOS transistor 411 for example, may be coupled to rail 401, and another voltage coupling device, such as pull-down NMOS transistor 412 for example, may be coupled to rail 402. In other embodiments, other voltage coupling devices may be used, including without limitation PMOS transistors.

A drain node of transistor 411 may be coupled to rail 401, and a source node of transistor 411 may be coupled to ground 410. A drain node of transistor 412 may be coupled to rail 402, and a source node of transistor 412 may be coupled to ground 410. A gate of transistor 411 may be coupled to receive an injection signal 413, and a gate of transistor 412 may be coupled to receive an injection signal 414. Injection signal 414 may be a complement of injection signal 413 for injection at two points 180 degrees apart from one another. Thus, transistors 411 and 412, gated with injection signals 413 and 414, respectively, provide injection points for pulling either rail 401 or 402 to ground. Injection signals 413 and 414 may be sourced from reference clock signal 203, as described below with reference to FIG. 5.

Figure 5:
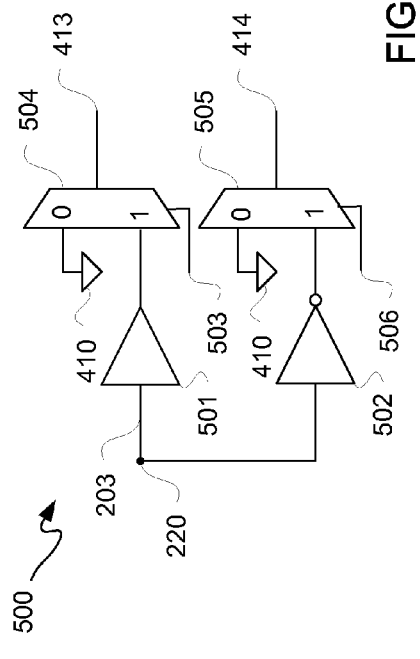
FIG. 5 is a circuit diagram depicting an exemplary control circuit, which may be included as part of an inverter.

FIG. 5 is a circuit diagram depicting an exemplary control circuit 500, which may be included as part of an inverter of inverters 302 for sourcing injections signals 413 and 414. Input node 220 may be coupled to inputs of buffer 501 and inverter 502. Buffer 501 may be used to equalize delay by passing through inverter 502. In other embodiments, other delay equalization may be used.

Input node 220 receives reference clock signal 203, which are input to buffer 501 and inverter 502. Output of buffer 501 may be provided as an input to multiplexer 504, and another input to multiplexer 504 may be coupled to ground 410 to provide a logic 0 input. Output of inverter 502 may be provided as an input to multiplexer 505, and another input to multiplexer 505 may be coupled to ground 410 to provide a logic 0 input. A control select signal 503 may be provided to multiplexer 504, and a control select signal 506 may be provided to multiplexer 505.

If no injection point is to be asserted, multiplexers 504 and 505 may both output a logic 0 for injection signals 413 and 414 responsive to control signals 503 and 506 both being a logic 0. If an injection point at 0 degrees is to be asserted, multiplexer 504 may output reference clock signal 203 as injection signal 413 and multiplexer 505 may output a logic 0 as injection signal 414 responsive to control select signals 503 and 506 respectively being a logic 1 and a logic 0. If an injection point at 180 degrees is to be asserted, multiplexer 505 may output an inverted version of reference clock signal 203 as injection signal 414 and multiplexer 504 may output a logic 0 as injection signal 413 responsive to control select signals 506 and 503 respectively being a logic 1 and a logic 0.

Figure 6:
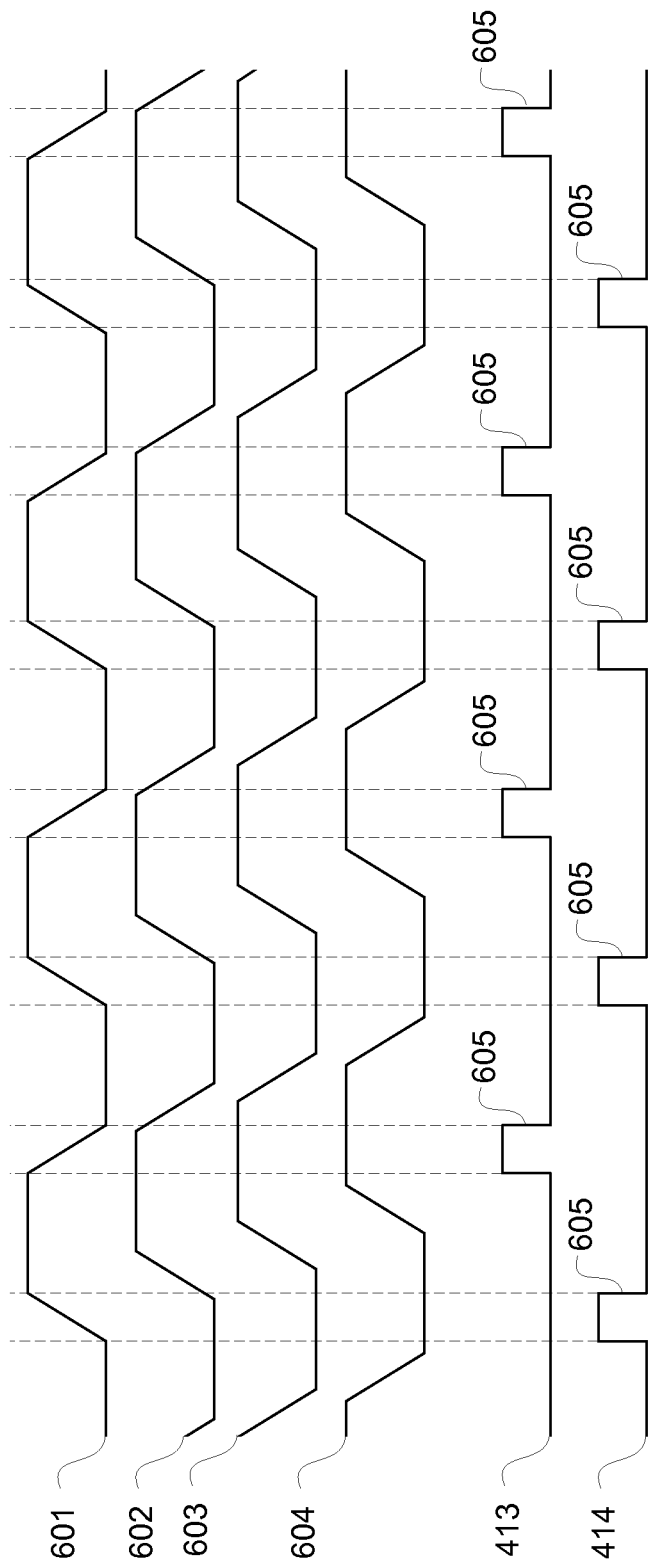
FIG. 6 is a signal diagram depicting exemplary injection lock waveforms of the PLL of FIG. 2.

FIG. 6 is a signal diagram depicting exemplary injection lock waveforms 601 through 604 of a PLL 200. More particularly, injection lock waveforms 601 through 604 are outputs, namely quadrature clock signals, from VCO 300 of FIG. 3 responsive to injection signals 413 and 414. With simultaneous reference to FIGS. 2 through 6, injection lock waveforms 600 are further described.

Injection lock waveform 601 is for a 0 degree injection clock. Injection lock waveform 602 is for a 180 degree injection clock. Injection lock waveform 603 is for a 90 degree quadrature injection clock. Injection lock waveform 603 is for a 270 degree quadrature injection clock. Injection lock waveforms 601 and 602 may be sourced from node 221-1, and injection lock waveforms 603 and 604 may be sourced from node 221-2.

Because injection pulses 605 of injection signals 413 and 414 are generated based on reference clock signal 203, injection frequency matches frequency of reference clock signal 203. These or other examples of injection locking may be used for fine-loop control of PLL 200. Injection lock waveforms 601 through 604 have low phase noise responsive to noise suppression as previously described.

By injecting on an edge, a waveform may be caused to go faster or slower. For example, pulse width of pulses 605 of injection signal 413 in this example covers leading edges of injection lock waveform 601, and pulse width of pulses 605 of injection signal 414 covers trailing edges of injection lock waveform 601. This is a way of injecting energy into a signal. For NMOS transistors pulling down to ground, covered trailing or falling edges of a waveform may be pulled down faster by having a helper pull down voltage, and covered leading or rising edges of a waveform may meet resistance due to a pull down voltage and thus may rise more slowly.

Over time edges of a clock signal may have some phase noise or offset from one another. By generating injection pulses 605 from a much less noisy signal with respect to phase noise, the spread or fuzz of edges due to phase noise is reduced. For example, if injection pulses 605 represent an reference, then deviation from such reference may be minimized or reduced. Generally, ring PLLs are slow; however, phase difference from one cycle to the next may be very fast as compared with a ring PLLs frequency. Thus, by having injection pulses 605, a high-speed filtering may be provided for fine grain filtering in contrast to a slower or coarse grain control by a control voltage of such ring PLL.

Accordingly, an injection-lock loop architecture has been described. Such injection-lock loop architecture combines low phase noise of a clock source, such as an LC PLL for example, and a low power consumption lock loop, such as a CMOS ring PLL for example, to produce clock signals, such as quadrature clocks for example. The injection-lock loop architecture leverages a high-Q reference signal to generate low phase noise output clock signals, such as quadrature clocks for example. An oscillator, such as a VCO for example, of such low power consumption lock loop may use a free-running frequency and lock-in range of an injection mechanism. This allows an overall system to leverage low-power oscillators, such as ring VCOs for example, for applications which would otherwise not be able to tolerate inherent phase noise of such low-power oscillators. Additionally, a lock-in range of an injection lock structure allows a ring PLL to be simplified to be able to use a first-order loop filter, which significantly reduces the overall size or floor plan of such ring PLL. Along those lines, using a phase-frequency detector ("PFD"), as described below in additional detail, in a frequency detector block along with an option to activate or deactivate injection pulses to a VCO can allow an injection-lock PLL to be selectively used as a first order PLL. Furthermore, due to a "dual-loop" or "dual control" configuration via a control voltage and a reference clock signal-based injection of pulses has been described, where a control voltage may be considered as a lower-bandwidth coarse control loop allowing a low-pass filter to be reduced to a first order filter, and where an injected reference clock may be considered a fine loop control.

As previously indicated, once two signals are close enough to one another in frequency, namely within a locking range, the two signals may lock to one another. So once a VCO is locked to a frequency range for example of a reference clock signal, the stronger reference clock signal may dominate the weaker voltage controlled signal of a ring PLL. If such a reference clock signal and a locked signal out of a VCO are both provided to a convention phase-frequency detector ("PFD"), there is a potential for a "stuck at" fault condition when frequency offset of two signals is matched yet there still may be a significant phase offset. In other words, even though phase may be moving due to some second order effects, frequency is the same when locked. Therefore, if a PFD is used for a frequency detector, such as frequency detector 205 of FIG. 2, phase information is to be purged while retaining frequency information. Xilinx, Inc. of San Jose, Calif., has a PFD that operates in excess of 16.0 GHz, so to convert this fast PFD or another PFD into a frequency detector is described below in additional detail.

Figure 7:
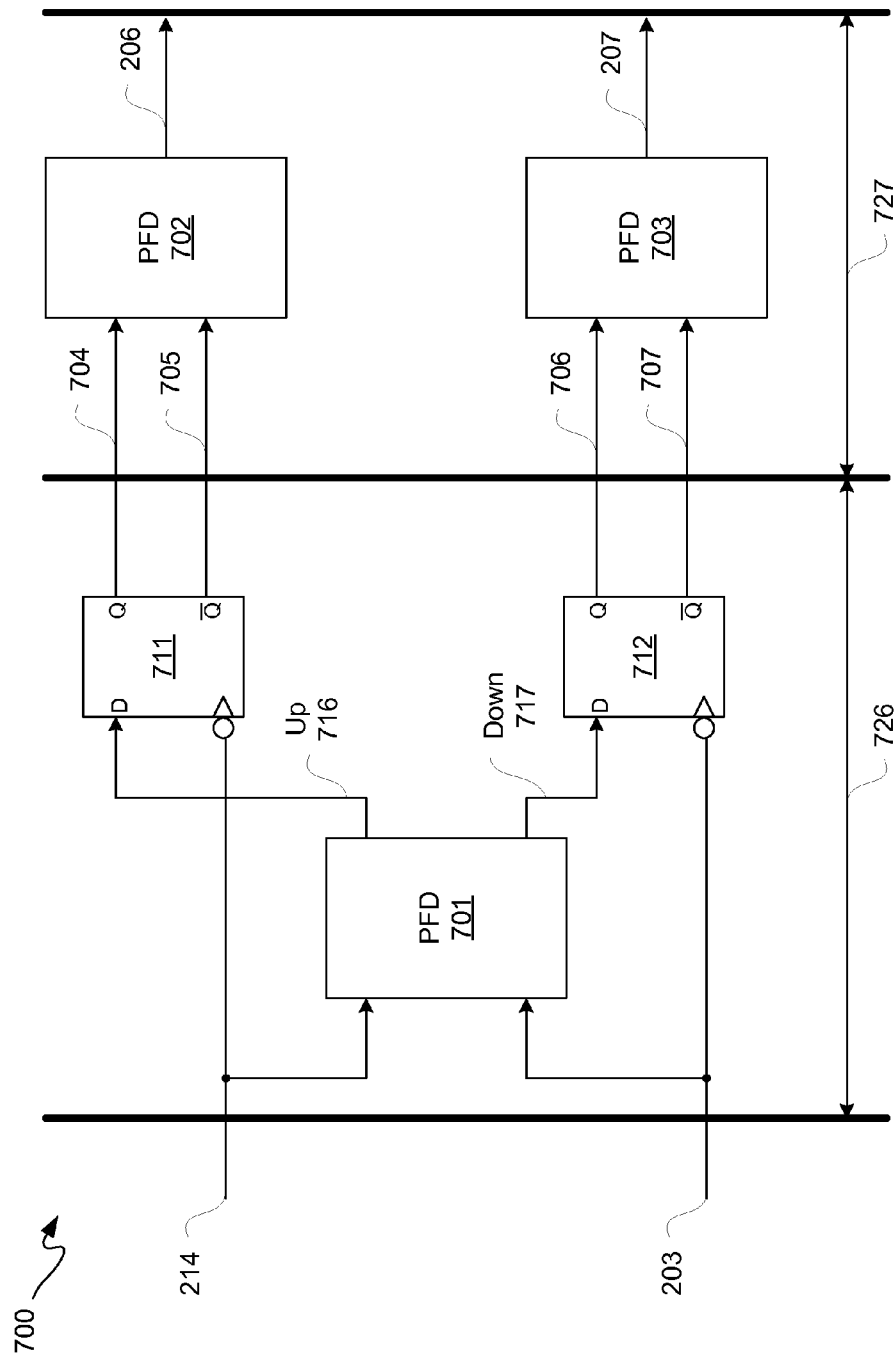
FIG. 7 is a block diagram depicting an exemplary frequency detector.

FIG. 7 a block diagram depicting an exemplary frequency detector 700. Frequency detector 700 may be used for frequency detector 205 of FIG. 2. However, frequency detector 700 need not be used as frequency detector 205, as other high-performance frequency detectors may be used. Frequency detector 700 includes a phase-frequency detector 701 coupled to receive oscillator output 214 and reference clock signal 203. Phase-frequency detector 700 may be configured to provide an up signal 716 and a down signal 717 responsive to oscillator output 214 and reference clock signal 203.

A register 711, which may be a D flip-flop, may be coupled to be clocked responsive to receiving oscillator output 214 and may be coupled to receive as a data input up signal 716 output from PFD 701. A register 712, which may be a D flip-flop, may be coupled to be clocked responsive to receiving reference clock signal 203 and may be coupled to receive as a data input down signal 717 output from PFD 701. PFD 701 and registers 711 and 712 are for a frequency offset detection stage 726. Such frequency offset detection may be performed at a full data rate. If there is a frequency offset as between reference clock signal 203 and oscillator output 214, then up signal 716 or down signal 717 may toggle.

A rank of flip-flops, such as registers 711 and 712, are used to remove phase information from up signal 716 and down signal 717, namely output of PFD 701. However, registers 711 and 712 may likewise have some phase information to be removed for purposes of providing a frequency detector output without phase information. Along those lines, excessive toggling may be suppressed with PFDs 702 and 703, as described below in additional detail. PFDs 702 and 703 are configured differently than known PFD 701, and thus description of PFDs 702 and 703 is provided below. Even though PFDs 702 and 703 are used to shorten pulse widths going into a charge pump of a ring PLL, other types of pulse width shortening circuits may be used to shorten pulse widths.

PFDs 702 and 703 are for a toggle detection stage 727. Toggle detection stage 727 may operate at half of a data rate. If frequency of oscillator output 214 and reference clock signal 203 match one another, then up output 206 and down output 207 may be static. PFD 702 may be coupled to receive true and inverted data outputs from register 711. PFD 703 may be coupled to receive true and inverted data outputs from register 712. Output 206 from PFD 702 is a toggle detected or reset output for an up side, namely an up output. Output 207 from PFD 703 is a toggle detected or reset output for a down side, namely a down output. Up output 206 and down output 207 may be provided as inputs to a charge pump 208.

Register 711 provides an up signal 704 and an inverted version of up signal 704, namely up signal 705, to PFD 702. Register 712 provides a down signal 706 and an inverted version of down signal 706, namely down signal 707, to PFD 703. PFD 702 may be coupled to provide an up output 206 to charge pump 208. PFD 703 may be coupled to provide a down output 207 to charge pump 208.

Generally, for each falling edge of oscillator output 214 and reference clock signal 203, up signal 716 and down signal 717 from PFD 701 are respectively sampled by registers 711 and 712. Data latched in registers 711 and 712 is output to PFDs 702 and 703, respectively. Generally, for small differences in phase, namely phase offset, between oscillator output 214 and reference clock signal 203, narrow pulses are generated, and for large differences in phase between oscillator output 214 and reference clock signal 203, wide pulses are generated. Either up or down increments may generate a longer pulse, as described below in additional detail.

Even though frequency detector 700 is described in terms of use with a ring PLL 200, frequency detector 700 may be used in a delay lock loop ("DLL"). By removing dividers 211 and 212 and replacing a VCO 204 with a voltage controlled delay line ("VCDL"), frequency detector 700 may be used in such a DLL. Because there is no ability to divide down in a DLL with a first order loop filter, frequency detector 700 has to be able to operate at a fast rate to support data communication rates in excess of 16 GHz. Frequency detector 700 is formed using a plurality of PFDs to operate at a communication data rate in excess of 16 GHz, and thus frequency detector 700 may be suitable to a PLL with little or no dividing down of frequency by dividers or in a DLL without any dividers.

Figure 8:
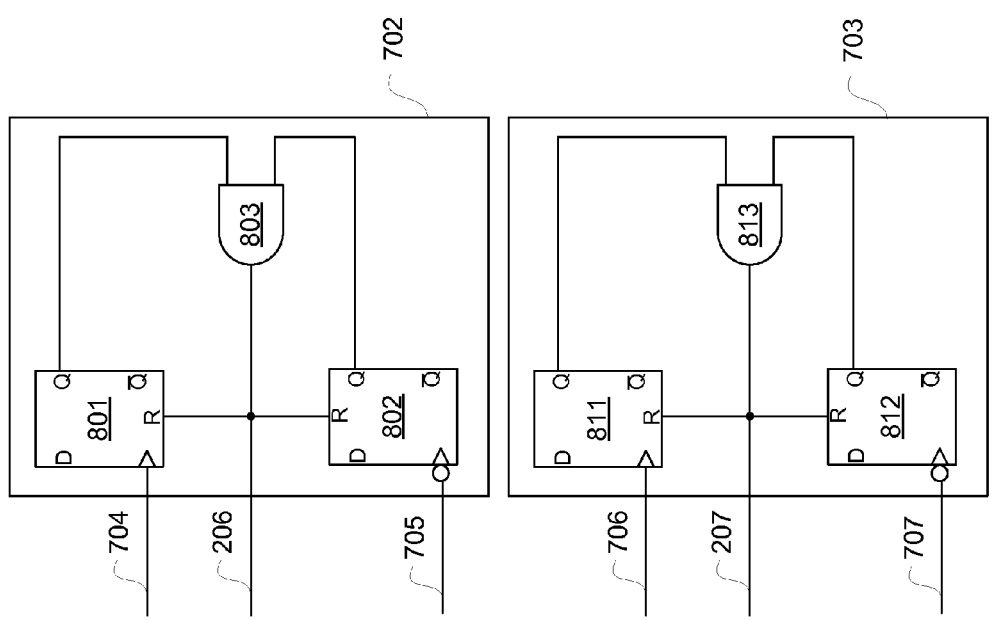
FIG. 8 is a circuit diagram depicting exemplary phase-frequency detectors ("PFDs") that can be used in the frequency detector of FIG. 7.

FIG. 8 is a circuit diagram depicting exemplary PFDs 702 and 703 that can be used in the frequency detector of FIG. 7.

PFD 702 includes a flip-flop 801 and a flip-flop 802. Flip-flop 801 may be coupled to receive an up signal 704 from register 711 to a clock port of flip-flop 801. Flip-flop 802 may be coupled to receive up signal 705 from register 711 to an inverted clock port of flip-flop 802. Data outputs of flip-flop 801 and flip-flop 802 are coupled as inputs to a logic gate, such as AND gate 803, which may be configured to provide a reset signal 206 as an output. Reset signal 206 is a toggle detect signal, which may be provided as up output 206. Flip-flop 801 and flip-flop 802 are coupled to receive reset signal 206 to respective reset ports thereof. PFD 702 may be coupled to provide reset signal 206 as an up output to charge pump 208 of FIG. 2.

PFD 703 includes a flip-flop 811 and a flip-flop 812. Flip-flop 811 may be coupled to receive a down signal 706 from register 712 to a clock port of flip-flop 811. Flip-flop 812 may be coupled to receive down signal 707 from register 712 to an inverted clock port of flip-flop 812. Data outputs of flip-flop 811 and flip-flop 812 are coupled as inputs to a logic gate, such as AND gate 813, which may be configured to provide a reset signal 207 as an output. Reset signal 207 is a toggle detect signal, which may be provided as down output 207. Flip-flop 811 and flip-flop 812 are coupled to receive reset signal 207 to respective reset ports thereof. PFD 703 may be coupled to provide reset signal 207 as a down output to charge pump 208 of FIG. 2.

Figures 3, 9:
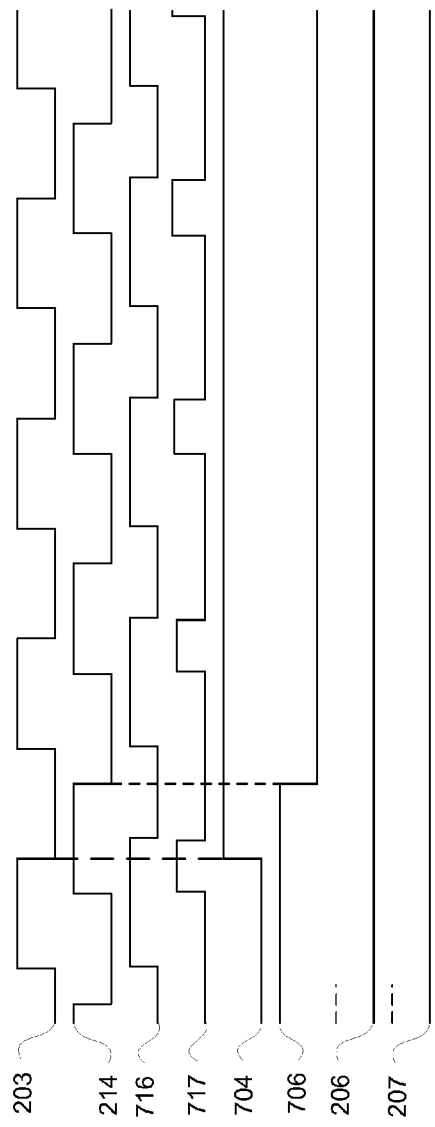
Figures 4, 9:
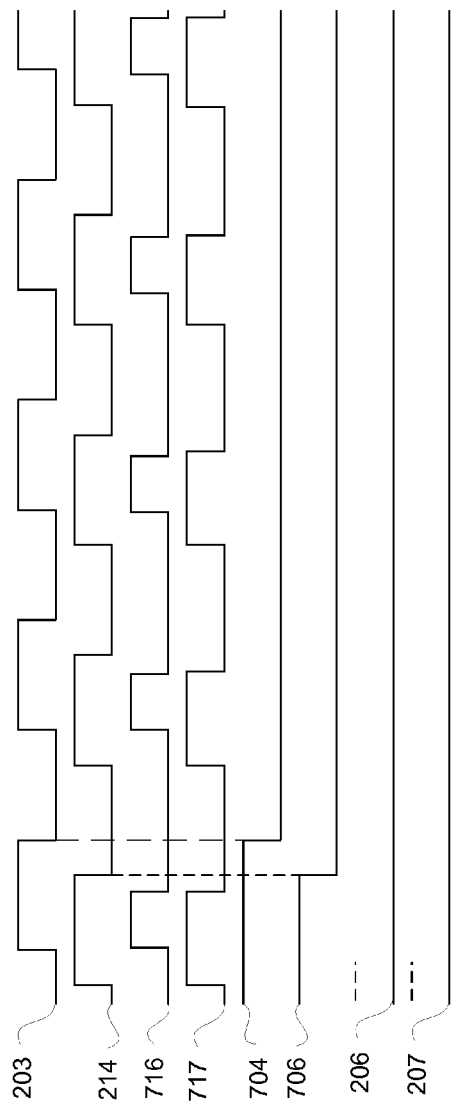

FIGS. 9-1 through 9-4 are signal diagrams depicting various waveforms for frequency detector 700.

FIG. 9-1 is a signal diagram for reference signal clock signal 203 having a frequency substantially less than oscillator output 214. Thus, down signal 706 may toggle responsive to trailing edges of pulses of oscillator output 214, and down output 207 may toggle responsive to trailing edges of pulses of down signal 706.

FIG. 9-2 is a signal diagram for reference clock signal 203 having a frequency substantially greater than oscillator output 214. Thus, up signal 704 may toggle responsive to trailing edges of pulses of reference clock signal 203, and up output 206 may toggle responsive to trailing edges of pulses of up signal 704.

FIG. 9-3 is a signal diagram for reference clock signal 203 and oscillator output 214 having equal frequencies, where reference clock signal 203 leads oscillator output 214. Up signal 704 is transitioned before down signal 706 from a logic low to a logic high level responsive to a trailing edge of a pulse of reference clock signal 203 and is static thereafter at such logic high level. Down signal 706 is later transitioned from a logic high to a logic low level responsive to a trailing edge of a pulse of oscillator output 214 and is static thereafter at such logic low level. Both up output 206 and down output 207 are static at logic lows.

FIG. 9-4 is a signal diagram for reference clock signal 203 and oscillator output 214 having equal frequencies, where reference clock signal 203 lags oscillator output 214. Down signal 706 is transitioned before up signal 704 from a logic high to a logic low level responsive to a trailing edge of a pulse of oscillator output 214 and is static thereafter at such logic low level. Up signal 704 is later transitioned from a logic high to a logic low level responsive to a trailing edge of a pulse of reference clock signal 203 and is static thereafter at such logic low level. Both up output 206 and down output 207 are static at logic lows.

It should be appreciated that frequency detector 700 may be configured to prevent it from giving erroneous up and/or down signals to a voltage control loop of ring PLL 200 once oscillator output 214 and reference clock signal 203 frequencies are matched. Control voltage is allowed to "float" within a lock-in range of reference clock signal 203, which minimizes or reduces time of injection pulling. Time of injection pulling occurs on or at a boundary of a VCO 300 lock-in range.

Furthermore, dual-mode operation may be facilitated by incorporation of PFD 701 into frequency detector 700. In an embodiment, multiplexers (not shown) may be used to select either using up signal 716 and down signal 717 or up output 206 and down output 207 as outputs to charge pump 208.

Figure 10:
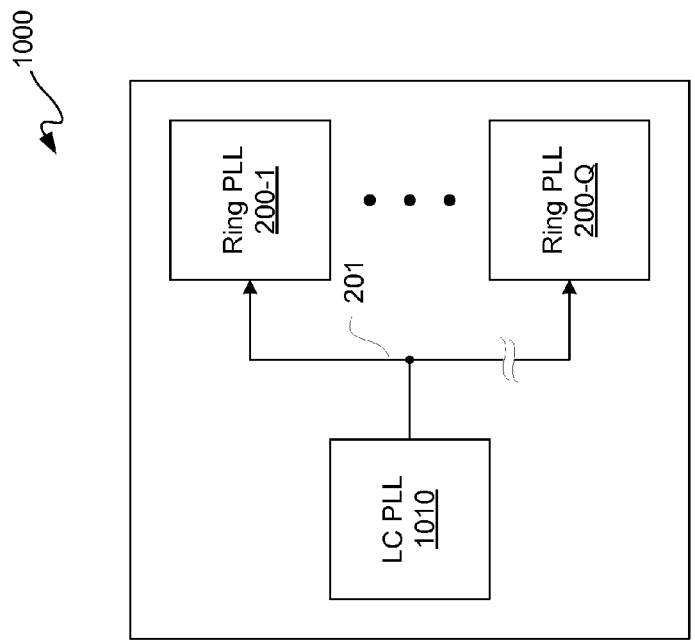
FIG. 10 is a block diagram depicting an exemplary semiconductor die.

FIG. 10 is a block diagram depicting an exemplary semiconductor die 1000. For line rates in excess of 20 gigabits per second, a semiconductor die 1000 may have multiple low power ring PLLs 200-1 through 200-Q, for Q a positive integer greater than one, coupled to receive a global reference clock signal 201 from an on or off die reference PLL, such as on-die LC PLL 1010 for example. Thus, provided a ring VCO for example was capable of reaching target frequencies, phase noise associated with such ring VCO may be sufficiently suppressed as previously described. This facilitates power distribution on a die 1000, as an LC PLL 1010 consumes significantly more power than a ring PLL 200 as described herein, and furthermore an LC PLL 1010 consumes more semiconductor area than a ring PLL 200 as described herein. A global LC PLL 1010 may service multiple ring PLLs 200-1 through 200-Q across physical interfaces ("PHYs") for either or both high-speed Ethernet protocols or lower-speed I/O protocols such as DDR3, DDR4, GDDR3, and GDDR5, for example. In other embodiments, global reference clock signal 201 may be provided off-chip or off-die to multiple ring PLLs 200-1 through 200-Q.

Multi-gigabit protocols, such as Gigabit Ethernet, PCIe, 10G KR, 10G Gigabit Ethernet, OTU2, XFP, and CEI ex., among others, may specify data line rates in excess of 10 gigabits per second. By providing a ring PLL 200 as a first order loop, high speed and low power may be provided with a relatively small size and stable PLL.

While the foregoing describes exemplary embodiments, other and further embodiments in accordance with the one or more aspects may be devised without departing from the scope thereof, which is determined by the claims that follow and equivalents thereof. Trademarks are the property of their respective owners.

What is claimed is:

1. An apparatus, comprising:
    a lock-loop circuit including an oscillator, a frequency detector, a charge pump, and a regulator;
    wherein the regulator is coupled to provide a regulated signal to the oscillator to control frequency;
    wherein the oscillator and the frequency detector are coupled to receive a reference clock signal;
    wherein the reference clock signal is coupled to the oscillator to suppress noise in the oscillator by pulse injection; and
    wherein the frequency detector is coupled to receive an oscillator output from the oscillator.

2. The apparatus according to claim 1, wherein the oscillator is a voltage controlled oscillator.

3. The apparatus according to claim 2, wherein the voltage controlled oscillator includes first inverters coupled to receive the regulated signal.

4. The apparatus according to claim 3, wherein:
    the first inverters are coupled in a ring;
    the voltage controlled oscillator includes second inverters coupled to the ring of the first inverters;
    the ring of the first inverters is to provide a main stage of the voltage controlled oscillator; and
    the second inverters are coupled to provide interpolation stages of the voltage controlled oscillator.

5. The apparatus according to claim 4, wherein the first inverters include injection points.

6. The apparatus according to claim 5, wherein:
    each of the first inverters is a two rail inverter; and
    rails of the first inverters are cross-coupled.

7. The apparatus according to claim 6, wherein each of the first inverters comprises:
    a first transistor coupled to a first rail;

a second transistor coupled to a second rail;
a first gate of the first transistor coupled to receive a first injection signal; and
a second gate of the second transistor coupled to receive a second injection signal.

8. The apparatus according to claim 7, wherein:
the first injection signal is the reference clock signal; and
the second injection signal is an inverted version of the reference clock signal.

9. The apparatus according to claim 1, wherein:
the lock-loop circuit further includes a first divider and a second divider;
the first divider is coupled to receive the oscillator output for dividing down a first frequency thereof to provide a divided down version of the oscillator output to the frequency detector; and
the second divider is coupled to receive the reference clock signal for dividing down a second frequency thereof to provide a divided down version of the reference clock signal to the frequency detector.

10. The apparatus according to claim 9, wherein:
the lock-loop yet further includes a loop filter and a level-shifter;
the loop filter is coupled between the charge pump and the regulator; and
the level-shifter is coupled to receive an external reference clock signal to provide the reference clock signal.

11. The apparatus according to claim 10, wherein the loop filter is a first order loop filter.

12. The apparatus according to claim 1, wherein the frequency detector is configured to be insensitive to phase offset between the reference clock signal and the oscillator output.

13. The apparatus according to claim 1, wherein the frequency detector comprises:
a first phase-frequency detector coupled to receive the oscillator output and the reference clock signal;
wherein the phase-frequency detector is configured to provide a first up signal and a first down signal responsive to the oscillator output and the reference clock signal;
a first register is coupled to be clocked responsive to the oscillator output and is coupled to receive the first up signal;
a second register is coupled to be clocked responsive to the reference clock signal and is coupled to receive the first down signal;
a second phase-frequency detector coupled to receive outputs from the first register; and
a third phase-frequency detector coupled to receive outputs from the second register.

14. The apparatus according to claim 13, wherein:
the first register provides a second up signal and an inverted version of the second up signal to the second phase-frequency detector; and
the second register provides a second down signal and an inverted version of the second down signal to the third phase-frequency detector.

15. The apparatus according to claim 13, wherein:
the second phase-frequency detector is coupled to provide an up output to the charge pump; and
the third phase-frequency detector is coupled to provide a down output to the charge pump.

16. The apparatus according to claim 13, wherein the second phase-frequency detector comprises:
a first flip-flop and a second flip-flop;
wherein the first flip-flop is coupled to receive a second up signal from the first register;
wherein the second flip-flop is coupled to receive an inverted version of the second up signal from the first register;
wherein outputs of the first flip-flop and the second flip-flop are coupled as inputs to a logic gate configured to provide a reset signal;
wherein the first flip-flop and the second flip-flop are coupled to receive the reset signal; and
wherein the second phase-frequency detector is coupled to provide the reset signal as an up output to the charge pump.

17. The apparatus according to claim 13, wherein the third phase-frequency detector comprises:
a first flip-flop and a second flip-flop;
wherein the first flip-flop is coupled to receive a second down signal from the second register;
wherein the second flip-flop is coupled to receive an inverted version of the second down signal from the second register;
wherein outputs of the first flip-flop and the second flip-flop are coupled as inputs to a logic gate configured to provide a reset signal;
wherein the first flip-flop and the second flip-flop are coupled to receive the reset signal; and
wherein the third phase-frequency detector is coupled to provide the reset signal as a down output to the charge pump.

* * * * *